United States Patent
Nishisaka

(10) Patent No.: US 10,483,039 B2
(45) Date of Patent: Nov. 19, 2019

(54) CONDUCTIVE PASTE FOR EXTERNAL ELECTRODE AND METHOD FOR MANUFACTURING ELECTRONIC COMPONENT INCLUDING THE CONDUCTIVE PASTE FOR EXTERNAL ELECTRODE

(71) Applicant: Murata Manufacturing Co., Ltd., Nagaokakyo-shi, Kyoto-fu (JP)

(72) Inventor: Yasuhiro Nishisaka, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 15/950,421

(22) Filed: Apr. 11, 2018

(65) Prior Publication Data

US 2018/0301280 A1  Oct. 18, 2018

(30) Foreign Application Priority Data

Apr. 17, 2017  (JP) .................................. 2017-081486

(51) Int. Cl.

| | | |
|---|---|---|
| *H01B 1/16* | (2006.01) | |
| *C09D 5/24* | (2006.01) | |
| *H01G 4/00* | (2006.01) | |
| *H01G 4/008* | (2006.01) | |
| *H01G 4/228* | (2006.01) | |
| *B22F 1/00* | (2006.01) | |

(52) U.S. Cl.
CPC ......... *H01G 4/0085* (2013.01); *B22F 1/0048* (2013.01); *B22F 1/0062* (2013.01); *C09D 5/24* (2013.01); *H01B 1/16* (2013.01); *H01G 4/228* (2013.01); *B22F 1/0011* (2013.01); *B22F 2301/10* (2013.01); *B22F 2304/10* (2013.01)

(58) Field of Classification Search
CPC ... H01B 1/00; H01B 1/16; H01B 1/22; C09D 5/24; C03C 14/004
See application file for complete search history.

(56) References Cited

U.S. PATENT DOCUMENTS

| | | | |
|---|---|---|---|
| 6,248,824 B1 * | 6/2001 | Decker | ............... C09D 183/04 106/600 |
| 2012/0260982 A1 * | 10/2012 | Adachi | .................... H01B 1/16 136/256 |
| 2013/0071968 A1 * | 3/2013 | Machii | ...................... C03C 8/16 438/98 |
| 2013/0148261 A1 | 6/2013 | Kim et al. | |
| 2016/0284892 A1 | 9/2016 | Jang et al. | |

FOREIGN PATENT DOCUMENTS

| | | |
|---|---|---|
| JP | 2011-138704 A | 7/2011 |
| JP | 2013-123024 A | 6/2013 |
| JP | 2014-220127 A | 11/2014 |
| KR | 1020150054352 A | 5/2015 |

* cited by examiner

Primary Examiner — Mark Kopec
(74) Attorney, Agent, or Firm — Arent Fox LLP

(57) ABSTRACT

A conductive paste for an external electrode that includes a conductive metal powder; a glass frit having an average particle diameter D50 of not more than 0.8 μm and having a flat shape with an average flatness of 1.5 to 5.5; and a binder resin. A method of manufacturing an electronic component includes preparing an electronic component element; applying the conductive paste for an external electrode onto an outer surface of the electronic component element; and baking the applied conductive paste to form an external electrode.

19 Claims, 2 Drawing Sheets

CONDUCTIVE PASTE FOR EXTERNAL ELECTRODE AND METHOD FOR MANUFACTURING ELECTRONIC COMPONENT INCLUDING THE CONDUCTIVE PASTE FOR EXTERNAL ELECTRODE

CROSS REFERENCE TO RELATED APPLICATIONS

The present application claims priority to Japanese Patent Application No. 2017-081486, filed Apr. 17, 2017, the entire contents of which are incorporated herein by reference.

BACKGROUND OF THE INVENTION

Field of the Invention

The present invention relates to a conductive paste for an external electrode and a method for manufacturing an electronic component including the conductive paste for an external electrode.

Description of the Related Art

In recent years, electronic components such as multilayer ceramic capacitors have been miniaturized, and thicknesses of external electrodes have also been reduced. In order to improve humidity resistance reliability of electronic components, a further improvement in denseness of external electrodes is required.

In order to densify external electrodes, it is effective to improve a filling factor of a conductive metal powder in a conductive paste containing a fine conductive metal powder.

In order to fill voids existing between conductive metal powders with glass by liquid phase sintering, it is preferable that a conductive paste includes a glass powder finer than a conductive metal powder.

Japanese Patent Application Laid-Open No. 2013-123024 discloses a conductive paste for an external electrode for forming an external electrode excellent in denseness, the conductive paste including a conductive metal powder and a spherical glass frit having an average particle diameter of 0.05 to 3.0 μm.

SUMMARY OF THE INVENTION

Meanwhile, a conductive paste for an external electrode usually contains a binder resin. The conductive paste is subjected to a degreasing process for decomposition and combustion of the binder resin for removal by heating the paste to a predetermined temperature, and then subjected to firing, whereby a conductive metal powder is sintered to be formed into an external electrode. A decomposition gas and a combustion gas generated by decomposition and combustion of the binder resin in the degreasing process are removed through a gap formed between the conductive metal powders, that is, a degreasing route.

However, in the conductive paste for an external electrode disclosed in Japanese Patent Application Laid-Open No. 2013-123024, for example when a spherical glass frit having an average particle diameter of not more than 0.8 is selected, the degreasing route through which the decomposition gas and the combustion gas pass cannot be secured between the conductive metal powders, and blisters (air bubbles) may be generated.

In order to solve the above-described problems, the present invention provides a conductive paste for an external electrode, which can improve a degreasing property to suppress generation of blisters and form a dense external electrode, and a method for manufacturing an electronic component that is suppressed in generation of blisters and has a dense external electrode.

A conductive paste for an external electrode of the present invention includes: a conductive metal powder; a glass frit having an average particle diameter D50 of not more than 0.8 μm and having a flat shape with an average flatness of not less than 1.5 and not more than 5.5; and a binder resin.

The glass frit may contain at least one selected from the group consisting of Ba, Ti, Al, Zn and Sr.

The glass frit may further contain B—Si-based glass.

A shape of the conductive metal powder may be spherical.

The conductive metal powder may be a Cu powder having an average particle diameter D50 of not more than 1.0 μm.

A method for manufacturing an electronic component according to the present invention includes the steps of: preparing an electronic component element; applying the conductive paste for an external electrode onto an outer surface of the electronic component element; and baking the conductive paste for an external electrode applied to form an external electrode.

The conductive paste for an external electrode of the present invention includes a glass frit having an average particle diameter D50 of not more than 0.8 μm and an average flatness of not less than 1.5 and not more than 5.5. Accordingly, when an external electrode is formed using the conductive paste for an external electrode, the amount of voids in a dried coating film is increased, and a route for degreasing can be secured, so that a degreasing property is improved. As a result, generation of blisters is suppressed and a dense external electrode can be formed.

Further, the method for manufacturing an electronic component according to the present invention can produce an electronic component that is suppressed in generation of blisters and has a dense external electrode.

DETAILED DESCRIPTION OF THE INVENTION

Figure 1:
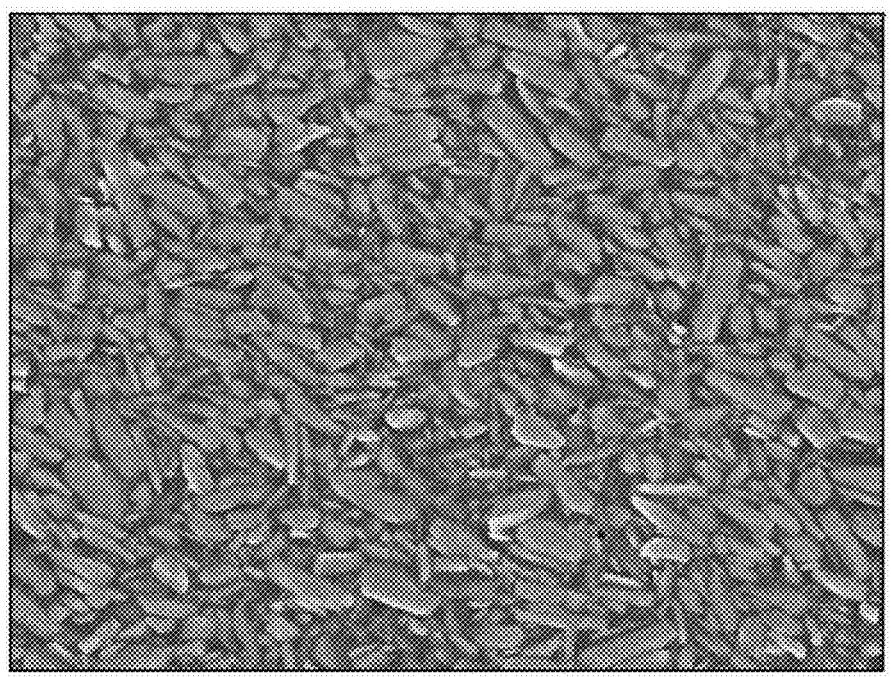
FIG. 1 is a photomicrograph of a glass frit taken with a scanning electron microscope at a magnification of 10,000 times and having an average flatness of not less than 1.5 and not more than 5.5.

Embodiments of the present invention will be described below, and characteristics of the present invention will be described in more detail.

A conductive paste for an external electrode according to one embodiment includes (a) a conductive metal powder; (b)

a glass frit having an average particle diameter D50 of not more than 0.8 μm and having a flat shape with an average flatness of not less than 1.5 and not more than 5.5; and (c) a binder resin.

The conductive metal powder of the above (a) is, for example, a Cu powder having a substantially spherical shape and an average particle diameter D50 of not more than 1.0 μm. However, the conductive metal powder is not limited to the Cu powder, and a Ni, Ag, or Sn powder or a powder of an alloy mainly composed of these metals may be used, for example. The shape of the conductive metal powder is not limited to a spherical shape.

The glass frit of the above (b) contains, for example, B—Si-based glass as a main component. The glass frit may further contain at least one selected from the group consisting of Ba, Ti, Al, Zn and Sr. When at least one selected from the group consisting of Ti, Al and Zn is contained in the glass frit, it is possible to improve plating resistance in the case of plating a surface of an external electrode formed using the conductive paste for an external electrode. Further, when Ba is contained in the glass frit, for example, entry of $BaTiO_3$ contained in a ceramic layer into the external electrode can be suppressed when a multilayer ceramic capacitor is manufactured.

The flatness of the glass frit is a value obtained by dividing the major axis of the glass frit, which has a flat shape, by the minor axis.

The binder resin of the above (c) is, for example, an acrylic resin. However, the binder resin is not limited to an acrylic resin, and a cellulose resin, a butyral resin, or the like may be used.

The conductive paste for an external electrode in the present embodiment can be used for forming an electronic component, for example, an external electrode of a multilayer ceramic capacitor. An electronic component including the conductive paste for an external electrode can be manufactured through the steps of preparing an electronic component element; applying the conductive paste for an external electrode in this embodiment onto an outer surface of the electronic component element; and baking the applied conductive paste for an external electrode to form an external electrode.

A step of drying the conductive paste for an external electrode may be included between the step of applying the conductive paste for an external electrode and the step of baking the applied conductive paste for an external electrode.

The method of applying the conductive paste for an external electrode may be various methods such as printing and dipping.

The electronic component element has, for example, a structure in which a plurality of ceramic layers and internal electrodes are alternately stacked.

EXAMPLES

In order to prepare a conductive paste for an external electrode, the conductive metal powder of the above (a), the glass frit of the above (b), the binder resin of the above (c), and terpineol as a solvent were provided.

As the conductive metal powder of the above (a), a Cu powder having a substantially spherical shape and an average particle diameter D50 of 1.0 μm was provided.

As the glass frit of the above (b), a plurality of types of glass frits obtained by adding Ba, Ti, Al, Zn and Sr to B—Si-based glass and in which at least one of the average particle diameter D50 and the average flatness was different were provided. Specifically, glass frits having an average particle diameter D50 of 0.5 μm and a respective average flatness of 1, 1.5, 5 and 9, glass frits having an average particle diameter D50 of 0.8 μm and a respective average flatness of 1, 1.3, 1.5, 3.1, 5.5 and 8, and glass frits having an average particle diameter D50 of 1.2 μm and a respective average flatness of 1, 1.2, 2.2, and 6 were provided.

As the binder resin of the above (c), an acrylic resin was provided.

As a conductive paste for an external electrode including the provided conductive metal powder, glass frit, binder resin, and terpineol as a solvent, samples Nos. 1 to 14 shown in Table 1 were prepared.

TABLE 1

| Sample No. | Average particle diameter D50 (μm) | Flatness | Presence or absence of generation of blisters | Humidity load test |
|---|---|---|---|---|
| *1 | 0.5 | 1 | X (60/100) | X (blister defect) |
| 2 | 0.5 | 1.5 | ○ (0/100) | ○ |
| 3 | 0.5 | 5 | ○ (0/100) | ○ |
| *4 | 0.5 | 9 | ○ (0/100) | X (lack of denseness) |
| *5 | 0.8 | 1 | X (11/100) | X (blister defect) |
| *6 | 0.8 | 1.3 | X (4/100) | ○ |
| 7 | 0.8 | 1.5 | ○ (0/100) | ○ |
| 8 | 0.8 | 3.1 | ○ (0/100) | ○ |
| 9 | 0.8 | 5.5 | ○ (0/100) | ○ |
| *10 | 0.8 | 8 | ○ (0/100) | X (lack of denseness) |
| *11 | 1.2 | 1 | ○ (0/100) | X (lack of denseness) |
| *12 | 1.2 | 1.2 | ○ (0/100) | X (lack of denseness) |
| *13 | 1.2 | 2.2 | ○ (0/100) | X (lack of denseness) |
| *14 | 1.2 | 6 | ○ (0/100) | X (lack of denseness) |

In Table 1, the samples marked with "*" in the sample numbers, that is, the samples Nos. 1, 4 to 6, and 10 to 14 are samples not satisfying the requirements of the present invention, that is, samples not satisfying the requirements of the above (b). On the other hand, the samples Nos. 2, 3, and 7 to 9 not marked with "*" in the sample numbers are samples satisfying the requirements of the present invention.

The average flatness of the glass frit was obtained by the following method. First, an appropriate amount of the glass frit was sampled, mixed with an epoxy resin, and then cured by adding a curing agent. Then, the cured resin was polished, and polishing sag was removed by milling to expose a cross section of the glass frit. Then, the cross section of the glass frit was observed with a scanning electron microscope (SEM) at a magnification of 10,000 times, the flatness was obtained by analyzation using a predetermined image analysis software, and an average value of a plurality of flatness measurements was obtained as an average flatness.

Figure 2:
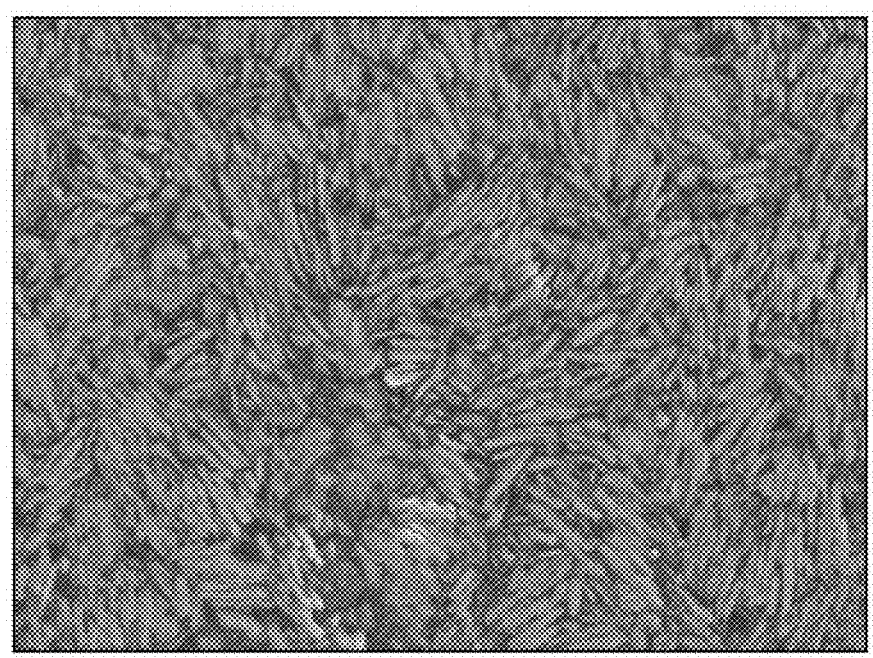
FIG. 2 is a photomicrograph of a glass frit taken with a scanning electron microscope at a magnification of 10,000 times and having an average flatness of more than 5.5.

FIGS. 1 and 2 are each photomicrographs of a glass frit taken with a scanning electron microscope at a magnification of 10,000 times. FIG. 1 is a view showing a glass frit having an average flatness of not less than 1.5 and not more than 5.5, and FIG. 2 is a view showing a glass frit having an average flatness of more than 5.5.

With respect to the samples Nos. 1 to 14 shown in Table 1, the presence or absence of blisters was confirmed, and a humidity load test was conducted.

<Confirmation of Presence or Absence of Blisters>

In order to confirm the presence or absence of blisters, a multilayer ceramic capacitor as an electronic component was produced using each conductive paste for an external electrode of the samples Nos. 1 to 14. Not less than 100 multilayer ceramic capacitors were produced using each conductive paste for an external electrode of the samples Nos. 1 to 14.

Specifically, first, an electronic component element formed by alternately stacking ceramic layers and internal electrodes was produced by a known method. Then, the conductive paste for an external electrode was applied to both end portions of the electronic component element in the longitudinal direction where the internal electrode was exposed, then dried, and baked to form a pair of external electrodes, so that a multilayer ceramic capacitor was produced. The conductive paste for an external electrode was applied such that the thickness after baking was 30 µm. The size of the produced multilayer ceramic capacitor was 1.0 mm in the length direction, 0.5 mm in the width direction, and 0.5 mm in the thickness direction.

Arbitrary 100 multilayer ceramic capacitors were selected from the not less than 100 multilayer ceramic capacitors produced above, and the external electrodes were observed with a microscope to confirm the presence or absence of generation of blisters. In this case, among 100 multilayer ceramic capacitors, those in which no blister was generated were judged as good (◯), and those in which at least one blister was generated were judged as poor (x).

<Humidity Load Test>

Twenty multilayer ceramic capacitors were produced using each conductive paste for an external electrode of the samples Nos. 1 to 14 by the same production method as the production method described above. However, surfaces of the pair of external electrodes were subjected to Ni plating and Sn plating.

The humidity load test was performed on the produced multilayer ceramic capacitor under conditions of a temperature of 125° C., a humidity of 95% RH, and an applied voltage of 3.2 V. In this humidity load test, a logarithmic value log IR of insulation resistance of the multilayer ceramic capacitor was measured. The case where at least one multilayer ceramic capacitor among the 20 multilayer ceramic capacitors had log IR that was decreased by two or more digits before a lapse of 24 hours from an initial value was judged as poor (x), and the case where no such a multilayer ceramic capacitor was not observed was judged as good (◯).

As shown in Table 1, in the multilayer ceramic capacitors each produced using the conductive paste for an external electrode of this embodiment including the glass frit having an average particle diameter D50 of not more than 0.8 µm and an average flatness of not less than 1.5 and not more than 5.5, no blister was generated, and in the humidity load test, there was no sample judged as poor.

The reason for this is as follows. That is, when an external electrode of an electronic component such as a multilayer ceramic capacitor is formed using the conductive paste for an external electrode including the glass frit having an average particle diameter D50 of not more than 0.8 µm and an average flatness of not less than 1.5 and not more than 5.5, a degreasing route can be secured as shown in FIG. 3A when the conductive paste for an external electrode is dried, so that a degreasing property is improved to suppress the generation of blisters, and a dense external electrode can be formed.

Figure 3A:
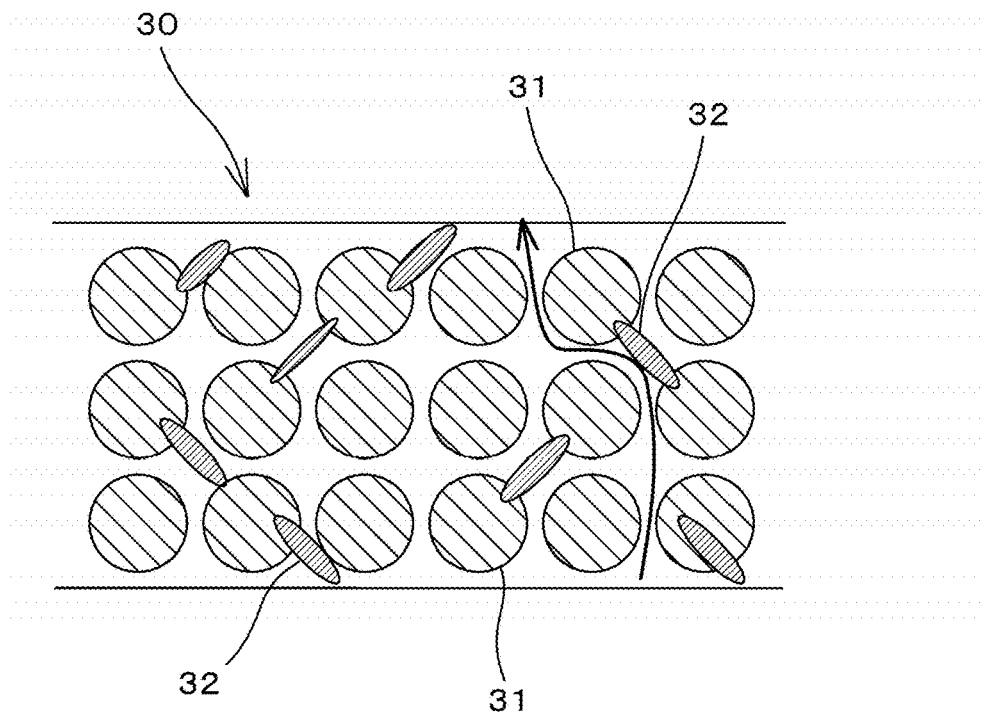
FIG. 3A is a schematic view for explaining a degreasing route when an external electrode of an electronic component is formed by using a conductive paste for an external electrode including a glass frit according to one embodiment of the present invention.

In FIG. 3A, an example of a degreasing route in a conductive paste 30 for an external electrode including a conductive metal powder 31 and a glass frit 32 having a flat shape is indicated by an arrow.

On the other hand, in the multilayer ceramic capacitors each produced using a conductive paste for an external electrode not satisfying the requirements of the present invention, that is, including a glass frit having an average particle diameter D50 of more than 0.8 µm or an average flatness of less than 1.5 or more than 5.5, at least one multilayer ceramic capacitor had blisters generated or judged as poor in the humidity load test.

Figure 3B:
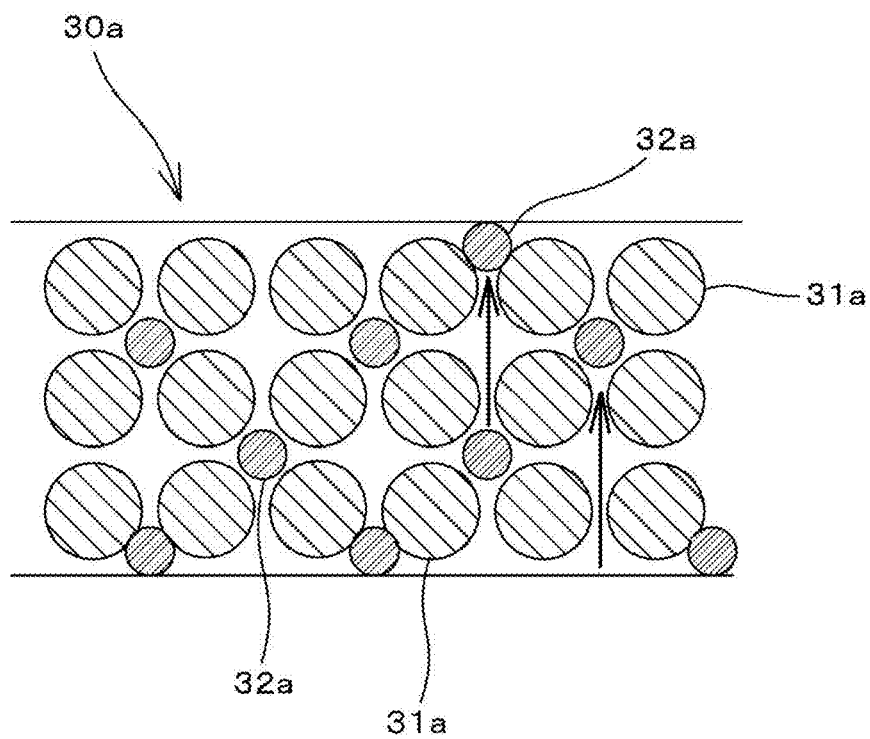
FIG. 3B is a schematic view for explaining that it is difficult to form a degreasing route when an external electrode of an electronic component is formed by using a conventional conductive paste for an external electrode including a glass frit having a spherical shape.

This is considered to be due to the following reason. When an external electrode is formed using a conductive paste for an external electrode including a glass frit having an average flatness of less than 1.5, as shown in FIG. 3B, a sufficient degreasing route cannot be secured, and gases such as carbon dioxide produced by firing cannot completely escape but remain in the external electrode, whereby blisters are generated. FIG. 3B shows that a sufficient degreasing route cannot be secured in a conductive paste 30a for an external electrode including a conductive metal powder 31a and a glass frit 32a having an average flatness of 1.

On the other hand, when an external electrode is formed using a conductive paste for an external electrode including a glass frit having an average flatness of more than 5.5, the denseness of the external electrode is lowered, and a defective product is produced in the humidity load test. Further, when an external electrode is formed using a conductive paste for an external electrode including a glass frit having an average particle diameter D50 of more than 0.8 µm, the denseness of the external electrode is lowered, and a defective product is produced in the humidity load test.

The present invention is not limited to the above embodiments, and various applications and modifications can be added within the scope of the present invention. For example, in the above-described embodiments, the multilayer ceramic capacitor is described as an example of the electronic component; however, the electronic component is not limited to the multilayer ceramic capacitor, and a laminated LC composite component, a laminated coil, a resistance component, a thermistor or the like may be used.

What is claimed is:

1. A conductive paste for an external electrode, the conductive paste comprising:
   a conductive metal powder;
   a glass frit having an average particle diameter D50 of not more than 0.8 µm and having a flat shape with an average flatness of 1.5 to 5.5; and
   a binder resin.

2. The conductive paste for an external electrode according to claim 1, wherein the glass frit contains at least one selected from Ba, Ti, Al, Zn and Sr.

3. The conductive paste for an external electrode according to claim 1, wherein the glass frit contains a B—Si-based glass.

4. The conductive paste for an external electrode according to claim 3, wherein a shape of the conductive metal powder is spherical.

5. The conductive paste for an external electrode according to claim 4, wherein the conductive metal powder is a Cu powder having an average particle diameter D50 of not more than 1.0 µm.

6. The conductive paste for an external electrode according to claim 1, wherein a shape of the conductive metal powder is spherical.

7. The conductive paste for an external electrode according to claim 6, wherein the conductive metal powder is a Cu powder having an average particle diameter D50 of not more than 1.0 µm.

8. The conductive paste for an external electrode according to claim 1, wherein the conductive metal powder is a Cu powder having an average particle diameter D50 of not more than 1.0 µm.

9. The conductive paste for an external electrode according to claim 1, wherein the binder resin is an acrylic resin.

10. A method for manufacturing an electronic component, the method comprising:
preparing an electronic component element;
applying conductive paste for an external electrode onto an outer surface of the electronic component element, the conductive paste comprising:
a conductive metal powder;
a glass frit having an average particle diameter D50 of not more than 0.8 μm and having a flat shape with an average flatness of 1.5 to 5.5; and
a binder resin; and
baking the conductive paste to form an external electrode on the outer surface of the electronic component element.

11. The method for manufacturing an electronic component according to claim 10, further comprising drying the conductive paste on the outer surface of the electronic component element before the conductive paste is baked.

12. The method for manufacturing an electronic component according to claim 10, wherein the glass frit contains at least one selected from Ba, Ti, Al, Zn and Sr.

13. The method for manufacturing an electronic component according to claim 10, wherein the glass frit contains a B—Si-based glass.

14. The method for manufacturing an electronic component according to claim 13, wherein a shape of the conductive metal powder is spherical.

15. The method for manufacturing an electronic component according to claim 14, wherein the conductive metal powder is a Cu powder having an average particle diameter D50 of not more than 1.0 μm.

16. The method for manufacturing an electronic component according to claim 10, wherein a shape of the conductive metal powder is spherical.

17. The method for manufacturing an electronic component according to claim 16, wherein the conductive metal powder is a Cu powder having an average particle diameter D50 of not more than 1.0 μm.

18. The method for manufacturing an electronic component according to claim 10, wherein the conductive metal powder is a Cu powder having an average particle diameter D50 of not more than 1.0 μm.

19. The method for manufacturing an electronic component according to claim 10, wherein the binder resin is an acrylic resin.

* * * * *